(12) United States Patent
Aarts

(10) Patent No.: US 7,924,011 B2
(45) Date of Patent: Apr. 12, 2011

(54) FERROMAGNETIC SHIELD FOR MAGNETIC RESONANCE IMAGING

(75) Inventor: Benjamin Hendricus Aarts, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 629 days.

(21) Appl. No.: 11/993,031

(22) PCT Filed: Jun. 21, 2006

(86) PCT No.: PCT/IB2006/052007
§ 371 (c)(1),
(2), (4) Date: Dec. 19, 2007

(87) PCT Pub. No.: WO2007/000687
PCT Pub. Date: Jan. 4, 2007

(65) Prior Publication Data
US 2010/0219832 A1 Sep. 2, 2010

(30) Foreign Application Priority Data
Jun. 28, 2005 (EP) .................................... 05105725

(51) Int. Cl.
*G01V 3/00* (2006.01)
(52) U.S. Cl. ...................................... 324/319; 324/320
(58) Field of Classification Search .................. 324/319, 324/320
See application file for complete search history.

(56) References Cited

U.S. PATENT DOCUMENTS

| 4,606,194 A | * | 8/1986 | Pirtle et al. ........................ 62/6 |
| 5,103,647 A | * | 4/1992 | Ackermann ........................ 62/6 |
| 5,363,077 A | * | 11/1994 | Herd et al. .................. 335/216 |
| 5,442,928 A | | 8/1995 | Laskaris et al. |
| 5,701,744 A | | 12/1997 | Eckels et al. |
| 6,683,456 B1 | | 1/2004 | Kinanen |
| 6,990,818 B2 | * | 1/2006 | Hofmann ........................... 62/6 |

FOREIGN PATENT DOCUMENTS

| EP | 0955555 A2 | 11/1999 |
| GB | 2292597 A | 2/1996 |
| JP | 02161260 A | 6/1990 |

* cited by examiner

*Primary Examiner* — Louis M Arana

(57) ABSTRACT

A cryocooler assembly includes a ferromagnetic shield and a moveable rare-earth regenerator for recondensing of a cooling liquid for cooling of a superconductive magnet of a magnetic resonance imaging apparatus. The ferromagnetic shield effectively provides depletion of a magnet field in the vicinity of the rare-earth regenerator and therefore on the one hand reduces the noise impact of the moving regenerator on the homogeneous magnetic field in the imaging volume of the MRI apparatus and on the other hand reduces the mechanical force exerted by the magnetic field on the rare-earth regenerator.

19 Claims, 5 Drawing Sheets

FERROMAGNETIC SHIELD FOR MAGNETIC RESONANCE IMAGING

FIELD OF THE INVENTION

The present invention relates to the field of magnetic resonance imaging and more particularly without limitation to magnetic shielding of a cryocooler of a magnetic resonance imaging system.

BACKGROUND AND PRIOR ART

Generation of magnetic fields for magnetic resonance imaging (MRI) typically makes use of superconductive coils providing a negligible electric resistance and thus a magnetic field of a required magnitude if supplied with an electric current. Superconductivity is typically achieved in a temperature region at a few Kelvin, e.g. in the range of 4 to 10 Kelvin, which is for instance around the boiling temperature of liquid helium. Once the magnet coil is cooled down to such a superconducting level, a current will continue to flow through the coil due to the negligible coil resistance even after the electric power supply is removed, thereby maintaining a strong, steady magnetic field.

In typical magnetic resonance imaging systems, the main superconducting magnet coils are arranged in a cylindrically shaped pressure vessel, which is contained within an evacuated vessel and forms an imaging bore in the central region. This main magnet coil develops a strong magnetic field in the imaging bore that has to be very homogeneous and temporally constant for accurate imaging.

Superconducting temperatures can be obtained by boiling a liquid cryogen, typically liquid helium within the pressure vessel. However the provision of a steady supply of liquid helium for a MRI system and its storage and use are difficult and costly.

As a consequence, mechanical displacement type cryocoolers for recondensing and recycling the boiled helium gas are commonly used in MRI systems. Cryocoolers might not only be used for recondensing liquid helium gas but also for cooling the superconductive coils directly. A type of cryocooler that is capable of providing a sufficient amount of cooling capacity uses rare-earth materials such as e.g. $Er_3Ni$, $HoCu_2$ or ErNiCo. The moving piston of a two-stage cryocooler is often referred to as displacer. The rare-earth materials are part of the regenerator of the second or cold stage and thus also part of the displacer. The reciprocating movement of the rare-earth materials produces relatively high heat capacity in the superconducting temperature range from 4 to 10 Kelvin because of magnetic transitions and therefore enables low temperature operation. However the rare-earth materials also feature non-negligible magnetic properties. They can be magnetized by the local magnetic field of the superconductive main magnet and thus behave like a moving magnet which can in turn cause magnetic field fluctuations and noise in the imaging volume of the superconductive main magnet. This leads to unacceptable image artifacts like ghosting in the acquired images and as a consequence the cryocooler has often to be switched off during a high-resolution scan process. This complicates the scanning process and diminishes the lifetime of the cryocooler.

The European Patent Application EP 0 955 555 discloses a cryocooler with a superconducting sleeve for a helium recondensing magnetic resonance imager. There, a magnetic superconducting shielding sleeve surrounds a portion of the rare-earth displacer in the terminal portion of the cryocooler housing. The shielding sleeve is in close proximity to the cold head of the cryocooler, is magnetically coupled to the magnet fields generated by moving of the rare-earth displacer, and surrounds 90-270° of the cold head to which it is thermally coupled. Superconducting flow of the currents induced in the shield by the magnetic fields generated by magnetization and movement of the rare-earth displacers oppose the induced magnetic field and shield the MRI imaging volume from the temporal and spatially varying magnetic fields generated by the movement of the rare-earth displacer.

Apart from the relatively high costs of superconductive material it has to be further guaranteed that the superconductive shield is also cooled to the superconductive temperature level.

The present invention therefore aims to provide an improved cryocooler assembly comprising a less cost intensive and more effective ferromagnetic shield for the rare-earth regenerator.

SUMMARY OF THE INVENTION

The invention provides a cryocooler assembly having a rare-earth regenerator for recondensing of a cooling liquid for cooling of a superconductive magnet or for directly cooling the superconductive magnet coils of a magnetic resonance imaging apparatus. The cryocooler assembly herein comprises a shield of ferromagnetic material, which at least partially surrounds the rare-earth regenerator of the cryocooler assembly.

The present invention is based on the insight that the movement of the magnetized rare-earth material in the local magnetic field of the superconductive magnet causes four main sources of noise on the magnetic field of the superconductive magnet in the imaging region. The four sources of noise are described in the following:

1.) The first source of noise is due to the change in distance of the magnetized rare-earth material with respect to the imaging volume caused by the reciprocating movement of the rare-earth material.

2.) The rare-earth regenerator is part of the moving displacer of a two-stage cryocooler.

The mechanical cycle of the displacer causes a thermodynamic cycle of the rare-earth regenerator. Therefore the regenerator creates a temperature gradient and thus the rare-earth material changes its temperature during a mechanical cycle of the displacer.

A temperature change causes a change in the magnetization intensity of the rare-earth material, which in turn causes noise on the magnetic field within the imaging region.

3.) The third source of noise is due to the inhomogeneity of the main magnetic field along the path of the reciprocating rare-earth material. The magnetic field gradient of the main magnetic field causes a change of the magnetization of the rare-earth material, which in turn causes noise on the magnetic field of the main magnetic field in the imaging region.

4.) The moving magnetized rare-earth regenerator can induce eddy currents in electro conductive elements of the assembly. The eddy currents in turn can generate magnetic fields that disturb the magnetic field in the imaging region.

The magnetic field fluctuations and noise caused by the moving rare-earth regenerator on the main magnetic field in the imaging region are disadvantageous since the image quality is diminished, sometimes even to the extent that the cryocooler has to be switched off during a scan.

In accordance with the invention, a shield of ferromagnetic material at least partially surrounding the rare-earth regenerator in the region where the rare-earth regenerator is moveable is used to reduce the magnitude of the magnetic field generated by the main magnet at the location of the rare-earth regenerator. The magnetization of the rare-earth regenerator is thus reduced and as a consequence the noise caused by the moving rare-earth regenerator on the magnetic field in the imaging region of the apparatus is reduced.

The present invention is particularly advantageous in that it facilitates a reduction of the gradient of the magnetic field generated by the main magnet at the location of the rare-earth regenerator. The change in magnetization of the rare-earth regenerator during its reciprocating movement is therefore diminished.

Thus the sources of noise listed above under item 1 and 3 are reduced. A lower magnetization and a lower change in magnetization also lead to lower induced eddy currents and thus the source of noise listed under item 4 is also reduced.

Another advantage of the invention is that it enables a substantial reduction of the noise source listed above under item 2 by use of the shield of ferromagnetic material designed so that the change in magnetization caused by the inhomogeneous magnetic field along the path of the regenerator compensates the change in magnetization caused by the temperature change of the rare-earth material.

As mentioned above the shield of ferromagnetic material diminishes the magnitude and gradient of the local superconductive main magnetic field at the location of the rare-earth regenerator. As a consequence the main magnetic field exerts a diminished force on the moving magnetized rare-earth regenerator. Lower forces on the rare-earth regenerator lead to reduced forces on the displacer. This causes a smoother cycle of the displacer, which results in an improvement of the cooling performance of the cryocooler and additionally increases the cryocooler lifetime.

The arguments given above in favor of the use of the ferromagnetic shield are set forth in more detail in the following.

According to a preferred embodiment, the shield of ferromagnetic material is adapted to reduce the magnitude of the magnetic field generated by the superconductive magnet of the magnetic resonance imaging apparatus in the surrounding of the rare-earth regenerator. Taking into account that the relation between magnetization intensity of the rare-earth material with respect to temperature strongly depends on the magnetic field strength, a sufficient decrease in temperature sensitivity of the rare-earth material with respect to magnetization can be effectively achieved by making use of the ferromagnetic shield. For typical rare-earth materials such as e.g. $Er_3Ni$, $HoCu_2$ or ErNiCo, the slope of the curve representing the relation between magnetization level and temperature decreases with decreasing applied magnetic field. Additionally, the overall level of magnetization of the rare-earth material decreases accordingly.

Consequently, by making use of a ferromagnetic shield around the second stage of a two stage cryocooler, the magnetic field inside the cryocooler and hence around the rare-earth regenerator can be reduced to a minimum leading to a minimum impact of the rare-earth regenerator movement to the main magnetic field applied for magnetic resonance image acquisition.

In a further preferred embodiment, the shield of ferromagnetic material is adapted to reduce a spatial inhomogeneity of the magnetic field in the vicinity of the rare-earth regenerator. In contrast to conventional shielding materials, due to its ferromagnetic properties, the ferromagnetic material generally exhibits a more homogeneous magnetization level and thus effectively reduces the spatial inhomogeneity of the magnetic field along the moving path of the moveable rare-earth regenerator.

As a result, the magnetization intensity change of the rare-earth regenerator is reduced during a mechanical cycle of the displacer. This leads as already mentioned above to a noise reduction on the magnetic field in the imaging region.

A reduction of the magnetization intensity change of the rare-earth regenerator also reduces the generation of eddy currents that might be induced in electro conductive components of the assembly. By keeping the eddy currents on a low level, the effect of AC heating can be appreciably reduced and thus preventing an undesired heating of the second stage. Additionally, as pointed out before, by keeping the eddy currents on a low level, the noise generated by the eddy currents on the magnetic field in the imaging region is kept at a low level.

According to a further preferred embodiment of the invention, the shield of ferromagnetic material surrounds at least 180° of the circumference of the distal end of a cold head of the cryocooler containing the rare-earth regenerator.

In another embodiment the shield of ferromagnetic material completely surrounds the circumference of the cold head in the region in which the rare-earth regenerator is moveable. In this way, a most effective shielding of the main magnetic field generated by the superconductive magnet of the magnetic resonance imaging apparatus can be achieved. However, a complete surrounding of the rare-earth regenerator may not be achievable due to the geometric structure of the cryocooler and/or the geometric structure of a bore of the magnetic resonance imaging apparatus being adapted to accommodate the cryocooler.

According to a further preferred embodiment of the invention, the shield of ferromagnetic material comprises slabs of rectangular geometry that are adjacently arranged in such a way, that they form a polygon-like sleeve that approximates a cylinder or a rectangular-like sleeve. The polygon-like form that approximates a cylinder is also referred to in the following as cylindrical-like form. In this embodiment the polygon-like sleeve that approximates a cylinder or the rectangular-like sleeve serves as the shield of ferromagnetic material. Preferably, the slabs comprise iron and feature a geometric structure such that the various slabs do not become magnetically saturated when the superconductive magnet of the magnetic resonance imaging apparatus is in operation.

According to a further preferred embodiment of the invention, the shield of ferromagnetic material is arranged inside a vacuum area that forms a bore that is suitable for bringing the cold head's distal end in thermal contact with a reservoir of the cooling liquid. Typically, the cooling liquid comprises liquid helium and has a temperature of around 4 Kelvin. In this embodiment, the cold head's distal end represents the distal end of the second stage of the two-stage cryocooler and contains the moving piston comprising the rare-earth regenerator.

According to a further preferred embodiment of the invention, the shield of ferromagnetic material is even embedded into the frame of the vacuum area. Alternatively, the frame of the vacuum area may comprise the ferromagnetic material and may thus represent the ferromagnetic shield itself. In this way the frame or housing of the vacuum area of the cryocooler assembly itself may be formed by a ferromagnetic material thus inherently providing magnetic shielding without the necessity of arranging additional magnetic shields. In particular, this embodiment allows for a space saving realization of the cryocooler assembly.

According to another preferred embodiment of the invention, the shield of ferromagnetic material is embedded in the frame of the cryocooler's cold head in such a way that it surrounds the rare-earth regenerator in close proximity. In this way, effective magnetic shielding can be achieved by implementing a magnetic shield into the cryocooler's cold head itself instead of arranging a magnetic shield in the vacuum area or in the frame or housing of the bore of the cryocooler assembly.

According to a further preferred embodiment of the invention, the shield of ferromagnetic material comprises layers of ferromagnetic material. Typically, the shield features numerous thin layers of ferromagnetic material, which allows for a universal adaptation of ferromagnetic shields to given or predetermined magnitudes of main magnetic fields generated by the superconductive magnet of the magnetic resonance imaging apparatus. In this way, depending on the required magnetic properties of the ferromagnetic shield, a large variety of ferromagnetic shields featuring the same geometric shape but providing different magnetic properties can be realized. In the other way also a large variety of ferromagnetic shields with equal magnetic properties but different geometric structure can in principle be designed and correspondingly produced.

According to a further preferred embodiment of the invention, the cryocooler assembly further comprises at least a second shield of ferromagnetic material. The at least second shield of ferromagnetic material can be arranged in various different ways with respect to the location and orientation of the shield of ferromagnetic material. If designed as a cylindrical like sleeve, the ferromagnetic shield as well as the at least second ferromagnetic shield may feature a different cylinder radius and may be arranged in a convoluted or nested way.

In a further preferred embodiment of the invention, the second shield of ferromagnetic material comprises a planar geometry and the at least second shield is arranged near the cryocooler's front end and is further oriented such, that its surface normal is substantially parallel to the long axis of the cryocooler. Hence, the surface normal of the at least second shield of ferromagnetic material substantially points in the same direction as the direction of movement of the rare-earth regenerator.

The present invention is particularly advantageous as it prevents the penetration of an external magnetic field in the vicinity of the cold heat and as it enables on the one hand to suppress the noise and fluctuations induced by the moving rare-earth regenerator on the magnetic fields generated by the superconductive magnet in the imaging region and on the other hand as it reduces the mechanical forces exerted on the displacer by the magnetic field generated by the main superconductive magnet leading to a better cryocooler performance and a higher lifetime.

BRIEF DESCRIPTION OF THE DRAWINGS

In the following, preferred embodiments of the invention will be described in detail by making reference to the drawings in which.

DETAILED DESCRIPTION

Figure 1:
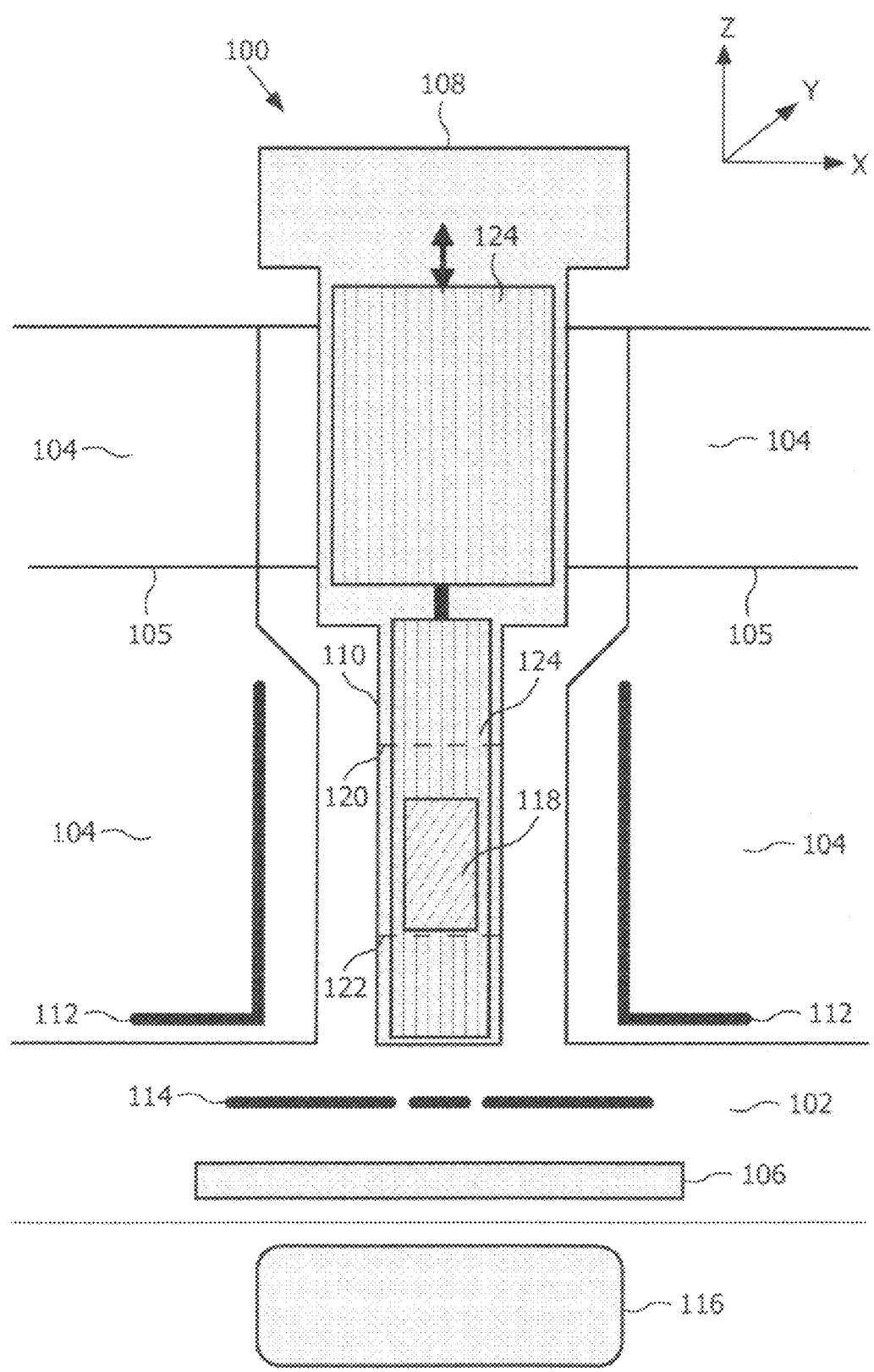
FIG. 1 schematically shows a cross section of the cryocooler assembly.

FIG. 1 illustrates a cross section of the cryocooler assembly 100, where the cryocooler 108 is located in the bore formed by the vacuum area 104. A radiation shield 105 at a temperature of about 20 Kelvin and located inside the vacuum area 104 shields the colder parts of the assembly, e.g. the cooling liquid reservoir 102, from thermal radiation. The second stage 110 of the cryocooler 108 featuring a narrow, slab like geometry whose distal end, i.e. the lower portion, is in thermal contact with the cooling liquid reservoir 102. The cooling liquid, which is e.g. liquid helium, provides cooling of the superconductive coil or superconductive magnet 106 for generating a highly uniform magnetic field for magnetic resonance imaging of an imaging area 116. As illustrated in the embodiment, the cryocooler assembly 100 has a ferromagnetic shield 112 surrounding the second stage 110 of the cryocooler 108 and hence surrounding the rare-earth regenerator 118.

The rare-earth regenerator 118 of the cryocooler 108 is a component of the displacer 124. The displacer 124 moves up and down as indicated by the arrow so that the rare-earth regenerator moves between the upper and lower limits 120, 122, respectively. Since a rather strong magnetic field is generated by the superconductive magnet 106, the rare-earth regenerator experiences a non-uniform magnetic field when moving between the two limits 120, 122. The mechanical cycle of the displacer 124 causes a thermodynamic cycle of the rare-earth regenerator. The temperature of the rare-earth regenerator increases therefore during the movement from 122 to 120 and decreases during the backward movement from 120 to 122.

Hence, due to its thermal properties, the rare-earth material 118 experiences a shift in temperature when moving from the lower limit 122 towards the upper limit 120 and vice versa.

Rare-earth materials, such as $Er_3Ni$, $HoCu_2$ or ErNiCo typically feature a magnetic moment in a surrounding magnetic field that strongly depends on the temperature. Consequently, when the displacer 124 moves back and forth within the cryocooler 108, the rare-earth regenerator 118 acts as a magnet with varying magnetic properties thus generating a magnetic field with varying magnitude severely influencing magnetic resonance imaging performed in the imaging area 116.

By applying the ferromagnetic shield 112 on the one hand the magnitude of the constant magnetic field generated by the superconductive magnet 106 decreases in the vicinity of the rare-earth regenerator 118 and on the other hand the ferromagnetic shields 112, 114 provide sufficient shielding for the imaging area 116. Hence, the magnetic field generated by the rare-earth regenerator 118 is effectively shielded and its impact on the imaging area 116 is effectively minimized by making use of the ferromagnetic shields 112, 114.

The ferromagnetic shields 112 and 114 also reduce the magnitude and gradient of the magnetic field generated by the superconductive magnet 106 in the vicinity of the rare-earth regenerator 118. This leads to a reduction of the mechanical force exerted by the main magnetic field on the moving magnetized rare-earth regenerator 118 and thus on the moving displacer 124. The reduced mechanical force leads to an increase of the cooling performance of the cryocooler and to an increase of the cryocooler lifetime.

Due to the cross sectional illustration of the cryocooler assembly 100, the cylindrical shape of the ferromagnetic shield 112 is only indicated featuring a long axis pointing in the vertical direction. In contrast, the second ferromagnetic shield 114 may feature a planar geometry and may be arranged in a horizontal way as illustrated. Also, in order to allow efficient recondensing of the cooling liquid at the lower end of the second stage 110 of the cryocooler 108, the second ferromagnetic shield 114 still has to allow a thermal contact between the cooling liquid reservoir 102 and the cold head or distal end of the cryocooler 108. Therefore, the second ferromagnetic shield 114 may feature a perforated structure in the vicinity of the cold head.

The ferromagnetic shields 112, 114 that are typically implemented as iron shields effectively provide a decrease of the magnitude of the magnetic field in the vicinity of the rare-earth regenerator 118. Since for lower applied magnetic fields the dependency between magnetic moment and temperature of the rare-earth material becomes less prominent, also the magnitude of a magnetic field generated by the moving rare-earth regenerator decreases, which provides a substantial improvement of imaging quality of the magnetic resonance imaging apparatus. In contrast to shields known in the prior art, a ferromagnetic shield effectively lowers the magnetic field in the vicinity of the cold head.

Figure 2:
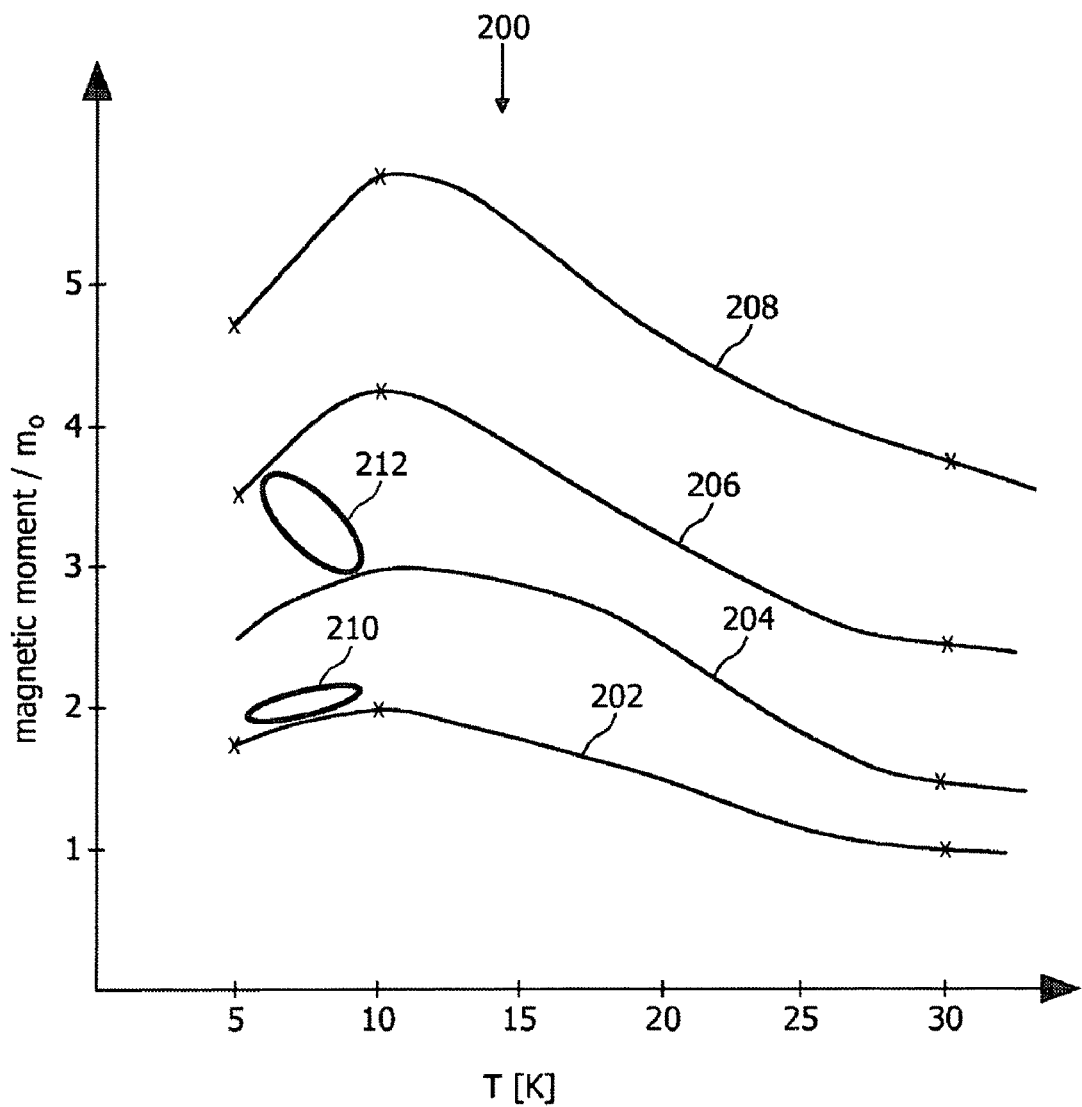
FIG. 2 shows a schematic diagram of magnetic moment vs. temperature of the rare-earth material.

FIG. 2 is illustrative of a magnetic moment v. temperature diagram 200 showing four different curves 202, 204, 206, 208 displaying the dependency between magnetic moment and temperature of a typical rare-earth material. The magnetic moment is normalized to a constant $m_0$, which is for typical rare-earth materials at the order of a few emu/g.

The four different curves 202, . . . , 208 are representative of four different externally applied magnetic fields having a magnitude of 0.2 T, 0.3 T, 0.4 T and 0.5 T, respectively. From the diagram can be seen that for an increasing magnetic field also the absolute value of the induced magnetic moment increases. Further, for lower externally applied magnetic fields the slope of the curves 202, . . . , 208 in the region between 4 and 10 Kelvin decreases. For instance, in the parameter region between 4 and 10 Kelvin the slope of curve 202 is much smaller than the slope of the curve 206. Consequently, having a lower magnetic field in the vicinity of the rare-earth regenerator 118 the impact of a varying temperature on the magnetic moment of the rare-earth regenerator 118 can be substantially reduced. Hence, by providing a decreased magnitude of the magnetic field in the vicinity of the cold head variations of the magnetic moment of the rare-earth material due to a temperature gradient, which in turn is due to the regenerator movement, can be minimized.

The cycle 212 shows the variation of the magnetic moment of the rare-earth material during a cycle of the regenerator and without any ferromagnetic shielding. The presence of a rather strong magnetic field produced by the superconductive magnet in the region of the rare-earth material in combination with the temperature change of the regenerator during a cycle leads to a rather large change of the magnetic moment of the rare-earth material which produces a high noise level on the magnetic fields generated by the superconductive magnets in the imaging area 116. As a consequence, the cryocooler has to be switched off when an actual measurement is performed in the imaging area 116.

The cycle 210 shows the variation of the magnetic moment of the rare-earth material during a cycle of the regenerator for the case where a ferromagnetic shielding 112 and 114 surrounds the regenerator. In the case of cycle 210 the magnetic field and magnetic field gradient generated by the main superconductive magnet along the path of the moving rare-earth regenerator are reduced so that the magnetic moment of the rare-earth regenerator is lower for lower temperatures. In other words, the magnetic moment is lower when the position of the rare-earth regenerator is close to the lower limit 122. This is in contrary to cycle 212.

Moreover, the ferromagnetic shielding can be arranged so that the magnetic field distribution produced by the main superconductive magnet along the path of the moving rare-earth regenerator induces a magnetic moment on the rare-earth material which compensates the change in the magnetic moment due to the temperature change. The magnet moment remains then constant during a cycle of the rare-earth regenerator.

Thus by reducing the overall magnitude of the magnetic field in the vicinity of the cold head of the cryocooler by means of the ferromagnetic shield 112, 114, the vertical amplitude of the cycle 212 can be effectively reduced as indicated by cycle 210 or can be reduced to zero as described above leading to a smaller or zero impact of the moving regenerator on the imaging magnetic field of the MRI apparatus.

This reduced impact may even allow for obtaining resonance images while the cryocooler is in operation. This would be beneficial for the lifetime of the compressor of the cryocooler as well as for the general handling of the MRI system.

Figure 3:
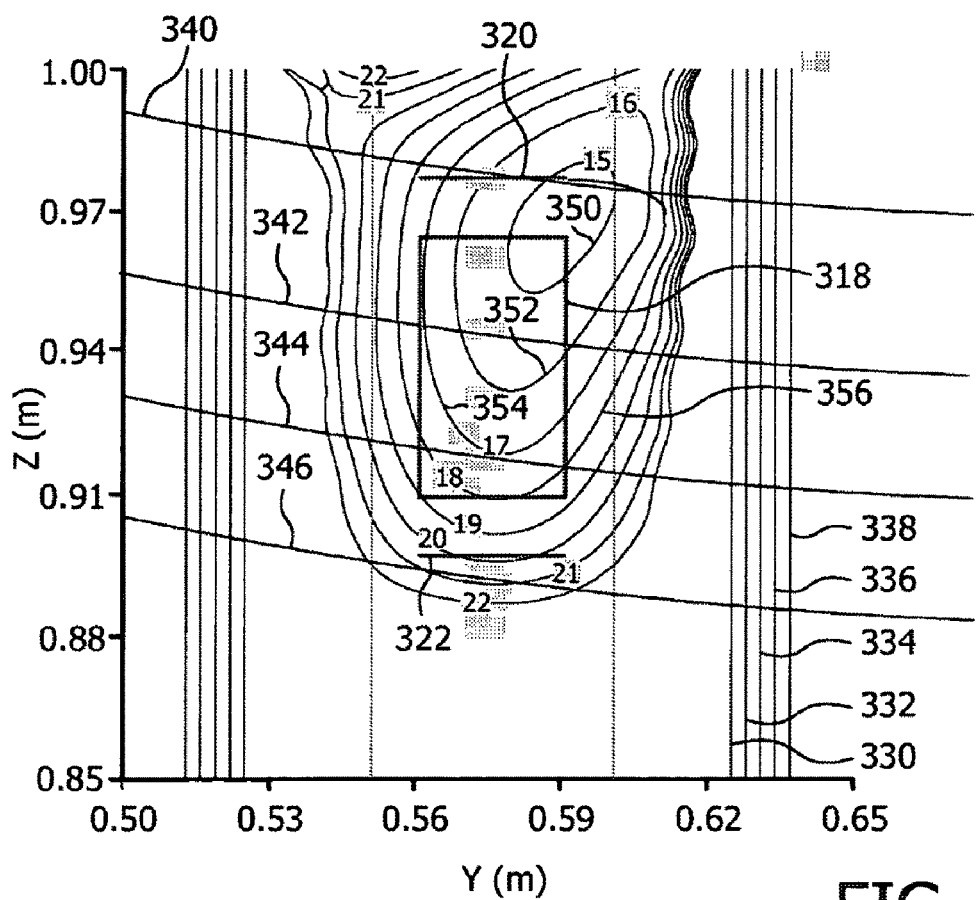
FIG. 3 shows a simulated contour plot of the shield's impact on the magnetic field in the vicinity of the rare-earth regenerator, FIG. 4 gives a perspective view of an inefficient shield design used for carrying out initial experimental tests.

FIG. 3 illustrates a simulated contour plot of the cold head second stage area with and without a shield of ferromagnetic material surrounding the cold head when the superconductive magnet 106 of the MRI system is in operation and produces a constant magnetic field. The contour lines 340, 342, 344 and 346 represent magnetic field lines of equal magnitude with a magnetic field strength of 120 mT, 140 mT, 160 mT and 180 mT, respectively. The position of the ferromagnetic shields is illustrated by various layers of ferromagnetic material 330, 332, 334, 336, 338.

The ferromagnetic shields implemented in the simulation are arranged around the cold head in a rectangular-like shape. The invention is however by now means limited to a rectangular-like shape.

The shielding of the superconductive main magnetic field due to the ferromagnetic shields will even improve when a round design is used.

The contour lines 340, . . . , 346 represent the magnetic field distribution in the absence of the ferromagnetic shields. Further, the rectangle 318 represents the position of the rare-earth regenerator 318 that is adapted to be moved between an upper position 320 and a lower position 322. Without application of ferromagnetic shields in a compressor cycle, the rare-earth regenerator experiences magnetic field amplitudes between 120 mT and 180 mT and hence a magnetic field gradient of almost 3 T/m.

As soon as the ferromagnetic shields are applied the distribution of the magnetic field lines drastically changes and can be represented by the contour lines 350, 352, 354, 356. For instance, contour line 350 corresponds to a magnetic field strength of 15 mT, contour line 352 corresponds to a magnetic field strength of 16 mT, contour line 354 corresponds to a magnetic field strength of 17 mT and contour line 356 corresponds to 18 mT. As a consequence, the absolute magnitude of the magnetic field in the vicinity of the rare-earth regenerator almost reduces by a factor of 10 and the spatial gradient in the magnetic field reduces from about 3 T/m to 0.25 T/m. The vertical height of the cycle 212 shown in FIG. 2 reduces remarkably when the ferromagnetic shields are present. The moving rare-earth regenerator still experiences a temperature gradient when moving between the upper and lower positions 320, 322 but since the absolute value of the present magnetic field reduces, the temperature induced change in magnetic moment reduces to a minimum as indicated by the cycle 210 of the diagram illustrated in FIG. 2.

In the simulation, the ferromagnetic shields have been assumed to be arranged in a rectangular design. However, the invention is by no means limited to a specific geometry of the ferromagnetic shields. The results of the simulation will be even more favorable for a cylindrical arrangement of the ferromagnetic shields.

Additionally large diversity and plurality of different magnetic shields is conceivable that may even provide an inversion of the gradient of the magnetic field in the vicinity of the rare-earth regenerator. For instance, providing the various layers of ferromagnetic material 330, . . . , 338 with a different thickness along e.g. the vertical direction, it might be possible to generate a magnetic field in the vicinity of the moving regenerator such that the magnitude of the magnetic field is smaller at the bottom position 322 than at the upper position 320.

It might also be possible to arrange the layers of ferromagnetic material 330, . . . , 338 so that a magnetic field distribution is generated in the space between the extreme upper 120 and extreme lower 122 positions of the moving rare-earth material so that the magnetic field induces a magnetic moment in the rare-earth material which compensates the change in the magnetic moment caused by the temperature change when the rare-earth material is moving from the cold region close to 122 to the hotter region 120 and vice versa.

In this case, it is principally possible to completely eliminate an impact of the moving rare-earth regenerator on the imaging area 116.

The ferromagnetic shield not only decreases the effective magnetic field in the vicinity of the cold head of the cryocooler but also provides effective shielding of a magnetic field generated by the moving rare-earth regenerator 318 towards the imaging area 116 of the MRI apparatus. Hence, the ferromagnetic shield provides a twofold function by effectively preventing the penetration of an external magnetic field in the vicinity of the cold head and by effectively reducing the impact of a magnetic field generated inside the cold head towards the imaging area 116.

Figure 4:
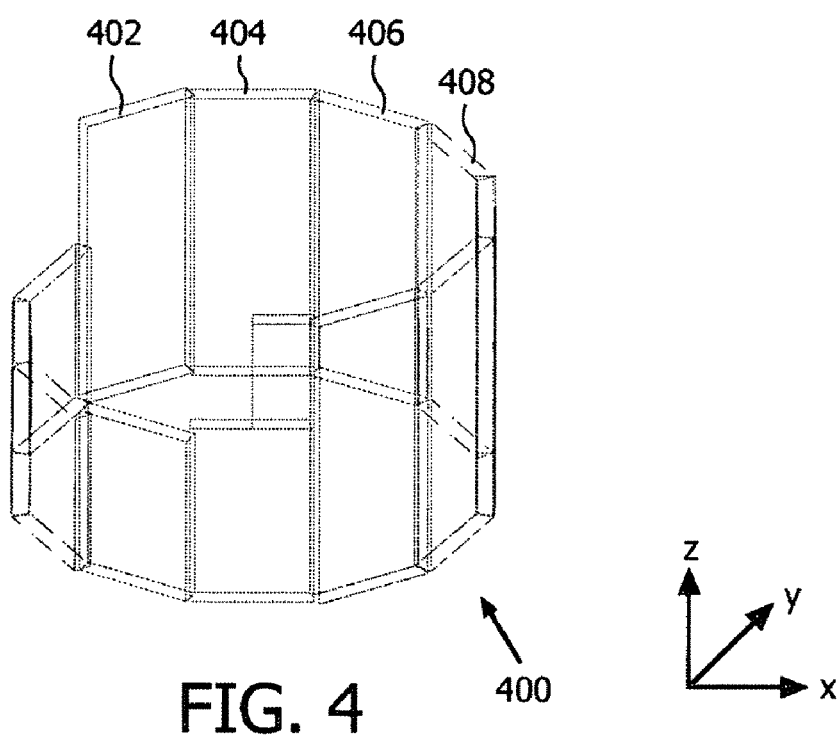

FIG. 4 shows a perspective illustration of the ferromagnetic shield 400 surrounding the cold head of the cryocooler 108. In this embodiment the ferromagnetic shield 400 has a cylindrical like shape and comprises various slabs 402, 404, 406, 408, each of which featuring a rectangular geometry. Due to geometric constraints of the bore formed by the vacuum areas 104 of the MRI apparatus the slabs 402, . . . 408 may feature a different height, i.e. a different prolongation in the z-direction. However, in preferred embodiments, the bottom part of the cylinder like ferromagnetic sleeve completely surrounds the second stage 110 of the cryocooler 108 in the vicinity of the rare-earth regenerator. In this way an effective shielding of an externally applied magnetic field can be achieved.

By effectively reducing the magnetic field in the inner area of the ferromagnetic shield 400, also mechanical stress that is due to magnetic forces is appreciably reduced allowing for a smooth movement of all mechanical parts of the second stage of the cryocooler 108. By lowering a mechanical stress on the mechanical components of the cryocooler, its overall performance with respect to cooling capacity can be appreciably enhanced in the presence of an effective magnetic field shielding. Hence, a thermal leakage can be minimized in this way.

Figure 5:
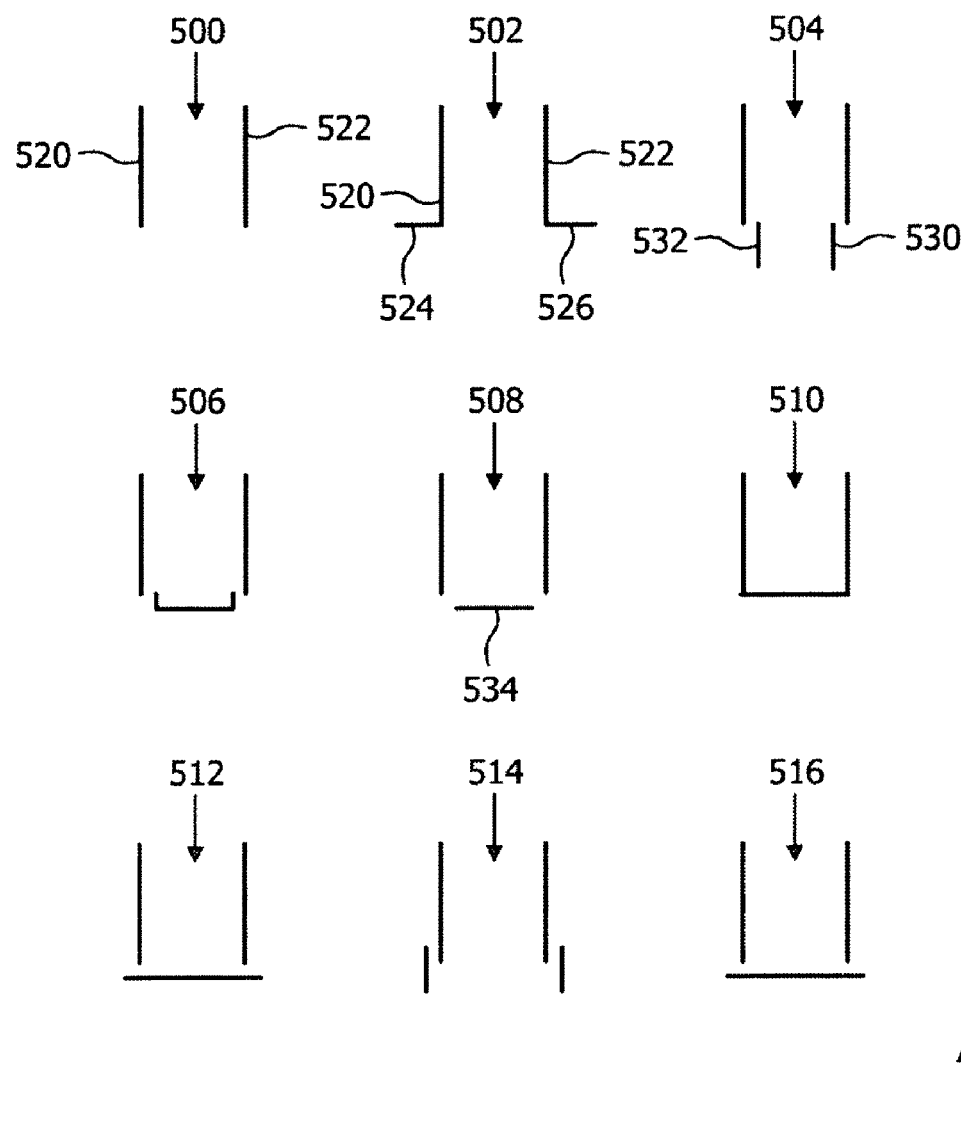
FIG. 5 shows various embodiments of first and second ferromagnetic shields.

FIG. 5 is illustrative of various embodiments 500, 502, 504, 506, 508, 510, 512, 514 and 516 of magnetic shield arrangements. The illustrated embodiment 500, . . . , 516 show cross sectional schematic views of the first ferromagnetic shield 520, 522 that typically features a cylindrical-like or rectangular-like shape. The second ferromagnetic shield may either feature a planar geometry 524, 526 or may also be designed as a cylindrical like structure 530, 532 being arranged e.g. in a convoluted way with respect to the first ferromagnetic shield.

The various configurations 500, . . . , 516 successively improve the effect of the magnetic field shielding. For instance, according to simulations, design 508 provides an improvement of almost 14% compared to the design 500, taking a rectangular-like shape for design 508 and 500 into account. Considering also a rectangular-like shape, configurations 514 and 516 even provide a shielding improvement of about 38% and 40%, respectively. With all of these configurations, it is important that the ferromagnetic material used in these arrangements does not reach a saturation magnetization threshold.

Figure 6:
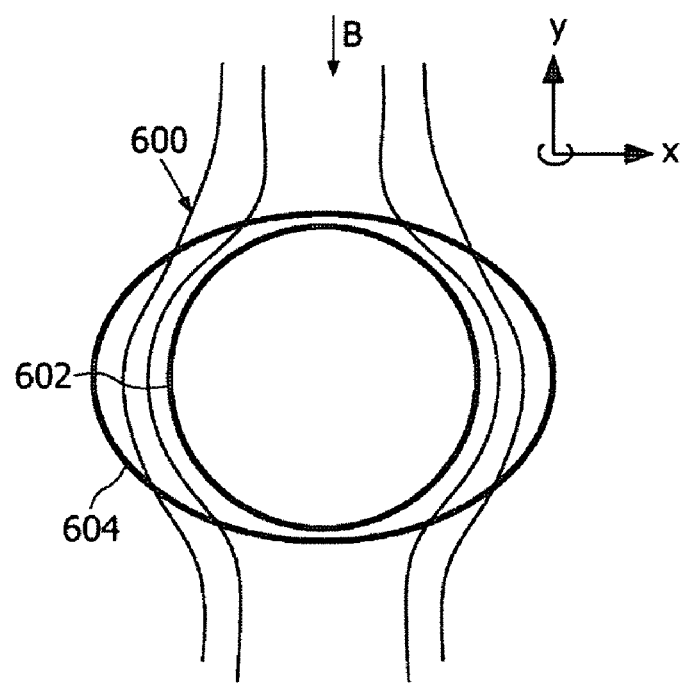
FIG. 6 shows a cross sectional view of an embodiment of the first ferromagnetic shield.

In the embodiment illustrated in FIG. 6, the first ferromagnetic shields are arranged so that the cross sectional area enclosed by the inner surface of the first ferromagnetic shield (602) is of circular form while the area enclosed by the outer surface (604) is of elliptical form. However the invention is by no means restricted to a circular or elliptical form of the inner or outer surface, respectively. More general embodiments of the first ferromagnetic shield comprise a varying shield thickness. Magnetic field lines are depicted in FIG. 6 in order to demonstrate how the ferromagnetic shield bends the magnetic field lines providing a shielding effect for the partially surrounded volume.

The invention therefore provides effective decreasing and shielding of the constant magnetic field generated by a superconductive magnet of a magnet resonance imaging apparatus in the vicinity of the cold head of a cryocooler assembly, which effectively allows for a reduction of the magnetic impact of a moving rare-earth regenerator on the image acquisition of the magnetic resonance imaging apparatus.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

LIST OF REFERENCE NUMERALS 100 cryocooler assembly
102 cooling liquid reservoir
104 vacuum area
105 radiation shield
106 superconductive magnet
108 cryocooler
110 second stage
112 ferromagnetic shield
114 second ferromagnetic shield
116 imaging area
118 rare-earth regenerator
120 upper limit
122 lower limit
124 displacer
200 magnetic moment vs. temperature diagram
202 curve
204 curve
206 curve
208 curve
210 cycle
212 cycle
318 rare-earth regenerator 320 upper limit
322 lower limit
330 ferromagnetic layer
332 ferromagnetic layer
334 ferromagnetic layer
336 ferromagnetic layer
338 ferromagnetic layer
340 magnetic field line
342 magnetic field line
344 magnetic field line
346 magnetic field line
350 magnetic field line
352 magnetic field line
354 magnetic field line
356 magnetic field line
400 ferromagnetic shield
402 ferromagnetic slab
404 ferromagnetic slab
406 ferromagnetic slab
408 ferromagnetic slab
500 ferromagnetic shield
502 ferromagnetic shield
504 ferromagnetic shield
506 ferromagnetic shield
508 ferromagnetic shield
510 ferromagnetic shield
512 ferromagnetic shield
514 ferromagnetic shield
516 ferromagnetic shield
520 first shield
520 first shield
524 second shield
526 second shield
530 second shield
532 second shield
534 second shield
600 ferromagnetic shield
602 inner surface of ferromagnetic shield
604 outer surface of ferromagnetic shield

The invention claimed is:

1. A cryocooler assembly having a rare-earth regenerator for recondensing of a cooling liquid for cooling of a superconductive magnet or for directly cooling the superconductive magnet coils of a magnetic resonance imaging apparatus, wherein the cryocooler assembly comprises a shield of ferromagnetic material at least partially surrounding the rare-earth regenerator, wherein the rare-earth regenerator is adapted to move between a cold region and a hotter region, wherein the shield of ferromagnetic material is adapted to generate a magnetic field between the cold and hotter region from the magnetic field of the superconductive magnet so that the magnetic field induces a magnetic moment in the rare-earth regenerator which compensates for a change of the magnetic moment of the rare-earth regenerator caused by the movement of the rare-earth regenerator between the cold region and the hotter region, wherein the shield of ferromagnetic material is arranged so that the cross sectional area enclosed by the inner surface of the shield is of circular form and so that the cross sectional area enclosed by the outer surface of the shield is of elliptical form.

2. The cryocooler assembly according to claim 1, wherein the shield of ferromagnetic material is adapted to reduce a spatial inhomogeneity of the magnetic field in the surrounding of the rare-earth regenerator.

3. A cryocooler assembly having a rare-earth regenerator which moves between a cold region and a hotter region for recondensing of a cooling liquid for cooling of a superconductive magnet or for directly cooling the superconductive magnet coils of a magnetic resonance imaging apparatus, the cryocooler assembly comprising:
a shield of ferromagnetic material at least partially surrounding the rare-earth regenerator, the shield of ferromagnetic material including a plurality of layers of ferromagnetic material.

4. The cryocooler assembly according to claim 3, wherein the shield of ferromagnetic material is adapted to reduce the magnitude of a magnetic field generated by the superconductive magnet in the surrounding of the rare-earth regenerator.

5. The cryocooler assembly according to claim 3, wherein the shield of ferromagnetic material is embedded in the frame of the cryocooler's cold head surrounding the rare-earth regenerator.

6. A cryocooler assembly having a rare-earth regenerator adapted to move between a cold region and a hotter region to recondense a cryogenic cooling fluid for cooling of a superconductive magnet or to directly cool the superconductive magnet coils of a magnetic resonance apparatus, the cryocooler assembly comprising at least:
a first shield of ferromagnetic material at least partially surrounding the rare-earth regenerator; and
a second shield of ferromagnetic material which at least partially shields the rare-earth generator and the superconducting magnet coils from each other.

7. The cryocooler assembly according to claim 6, wherein the first shield of ferromagnetic material surrounds at least 180° of the circumference of the distal end of a cold head of a cryocooler containing the rare-earth regenerator.

8. The cryocooler assembly according to claim 7, wherein the first shield of ferromagnetic material completely surrounds the circumference of the cold head in the region in which the rare-earth regenerator is moveable.

9. The cryocooler assembly according to claim 6, wherein the first shield of ferromagnetic material includes slabs of rectangular geometry which are adjacently arranged forming a cylindrical-like sleeve.

10. The cryocooler assembly according to claim 9, wherein the slabs are of at least two different heights.

11. The cryocooler assembly according to claim 6, wherein at least one of the first and second shields of ferromagnetic material is arranged inside a vacuum area forming a bore being suitable for bringing the cold head's distal end in thermal contact with a reservoir of the cooling liquid.

12. The cryocooler assembly according to claim 11, wherein the first shield of ferromagnetic material is embedded into the frame of the vacuum area or wherein the first shield of ferromagnetic material forms the frame of the vacuum area.

13. The cryocooler assembly according to claim 6, wherein the second shield of ferromagnetic material includes a planar geometry.

14. The cryocooler assembly according to claim 6, wherein the first and second shields of ferromagnetic material are arranged to reduce the mechanical forces exerted by the magnetic field of the superconductive magnet on the rare-earth regenerator.

15. The cryocooler assembly according to claim 6, wherein the second shield is arranged near a distal end of the cryocooler and is oriented substantially perpendicular with respect to a long axis of the cryocooler.

16. The cryocooler assembly according to claim 15, wherein the second shield defines apertures through which the cooling fluid flows.

17. The cryocooler assembly according to claim 6, wherein the first shield has a cylindrical inner surface with a circular form and the second shield has a cylindrical outer surface with an elliptical form.

18. The cryocooler assembly according to claim 6, wherein the second shield is disposed in a reservoir of the cooling fluid.

19. The cryocooler assembly according to claim 6, wherein the first shield of ferromagnetic material is adapted to generate a magnetic field between the cold and hotter region from the magnetic field of the superconductive magnet so that the magnetic field induces a magnetic moment in the rare-earth regenerator which compensates for a change of the magnetic moment of the rare-earth regenerator caused by the movement of the rare-earth regenerator between the cold region and the hotter region.

* * * * *